United States Patent

Baarman et al.

[11] Patent Number: 6,069,548
[45] Date of Patent: May 30, 2000

[54] PLANAR TRANSFORMER

[75] Inventors: Gösta Baarman, Siuntio kk; Seppo Pelkonen, Vantaa, both of Finland

[73] Assignee: Nokia Telecommunications Oy, Espoo, Finland

[21] Appl. No.: 09/228,632

[22] Filed: Jan. 11, 1999

Related U.S. Application Data

[63] Continuation of application No. PCT/FI97/00436, Jul. 3, 1997.

[30]     Foreign Application Priority Data

Jul. 10, 1996 [FI] Finland ..................................... 962803

[51] Int. Cl.⁷ ............................. H01F 27/06; H01F 27/29; H01F 27/30
[52] U.S. Cl. ............................. 336/65; 336/192; 336/200; 336/232
[58] Field of Search ..................................... 336/192, 200, 336/232, 65; 29/602.1

[56]        References Cited

U.S. PATENT DOCUMENTS

| 4,873,757 | 10/1989 | Williams ................................. 336/200 |
| 5,321,380 | 6/1994 | Godek et al. . |
| 5,598,135 | 1/1997 | Maeda et al. ............................ 336/200 |

FOREIGN PATENT DOCUMENTS

| 0 318 955 | 6/1989 | European Pat. Off. . |
| 2409881 | 9/1975 | Germany ................................ 336/200 |
| 24 26 485 | 12/1975 | Germany . |
| 58-21806 | 2/1983 | Japan .................................... 336/200 |
| 2-101715 | 4/1990 | Japan .................................... 336/200 |
| 3-78218 | 4/1991 | Japan .................................... 336/200 |
| 3 181 191 | 8/1991 | Japan . |
| 3-283404 | 12/1991 | Japan .................................... 336/200 |
| 5-82350 | 4/1993 | Japan .................................... 336/200 |
| 5-291062 | 11/1993 | Japan .................................... 336/200 |
| 6-36936A | 2/1994 | Japan .................................... 336/200 |
| 2 285 892 | 7/1995 | United Kingdom . |

OTHER PUBLICATIONS

A copy of the International Search Report for PCT/FI97/00436.

*Primary Examiner*—Thomas J. Kozma
*Attorney, Agent, or Firm*—Alter Law Group LLC

[57]        ABSTRACT

The invention relates to a planar transformer arrangement for an electric circuit located on a circuit board. The arrangement comprises (a) a first circuit board (PCB1) on which said electric circuit has been implemented, (b) a supplementary circuit board piece (PCB2), (c) a primary winding which comprises at least one substantially planar conductive pattern formed on a circuit board, (d) a secondary winding which comprises at least one substantially planar conductive pattern formed on a circuit board, and (e) a transformer core (F1, F2) which surrounds the primary and secondary windings at least partially. To create an inexpensive but efficient transformer structure suitable for use in an automatic manufacturing process, both the primary and the secondary windings have been formed on the supplementary circuit board piece (PCB2).

5 Claims, 4 Drawing Sheets

PLANAR TRANSFORMER

This is a continuation of PCT/FI97/00436, filed under 35 U.S.C. 111(a). The international filing date of the application is Jul. 3, 1997.

FIELD OF THE INVENTION

The invention relates generally to a transformer implemented on a circuit board, especially to a planar transformer implemented on a circuit board. The term planar transformer means, in this context, a transformer structure in which the windings have been implemented by using substantially planar conductive patterns; at least two of which are stacked upon one another so that there is an insulating layer between two successive conductive layers.

BACKGROUND OF THE INVENTION

The invention relates especially to power supplies which are implemented on the circuit board of an electronic device. The circuit board typically contains a great number of other circuits, with the power supply located on the board providing the supply voltage for said circuits. The power of such power supplies is typically 2 to 100 W. One operation environment is formed by telecommunication devices with subracks often containing several parallel circuit boards, each of which requires a separate power supply.

In power supply circuits located on a circuit board, which are typically switched mode power supplies, the planar transformers are traditionally implemented as discrete components in which thin winding plates manufactured, for example, from copper plate or folio are stacked alternatively with insulator folios in a stack around which is attached a ferrite core. The drawback of this kind of traditional structure is its price; the manufacture of the layers and their stacking into a stack, and equipping the component with connectors for connection to the circuit board make the price of a single transformer high.

This drawback has been eliminated in new transformers in which the transformer windings are integrated on the same circuit board as that on which the power supply has been implemented. This kind of structure is illustrated in FIG. 1, which shows four conductive layers A to D of a multiple layer circuit board PCB1, on each of which has been implemented the desired winding pattern WP1 to WP4. These winding patterns form together the windings of a transformer (primary and secondary windings). In the example shown in the figure, the transformer core is formed of the ferrite pieces F1 and F2 with an E profile. For the ferrites the circuit board includes holes H1 to H3 which go through the board at the location of the arms of the E. The ferrite pieces are pushed from the opposite sides of the circuit board into the holes, whereby they settle in the holes against one another so that the end surfaces of the arms of the E settle against one another. After this the pieces are locked to the circuit board by using a suitable mechanical locking piece.

Such a structure which has been integrated to the circuit board has, however, current tolerance and efficiency problems caused by the fact that the structure of the transformer, especially the thickness and number of the winding layers, is dependent on the circuit board on which the power supply has been implemented. The layer thickness of a multiple layer circuit board is nowadays already unduly thin (typically 35 $\mu$m) when considering the power required from the power supply, and it can be predicted that the layer thicknesses will decrease even further. In this kind of structure the conductors inevitably become very thin, which causes low efficiency in the power supply, especially when using high power.

These problems can be solved by using a transformer structure in which part of the transformer windings are implemented on a separate substrate (piece of circuit board) which is placed on the circuit board (mother board) on which the rest of the transformer windings and the rest of the components (among others, the power supply) are implemented. This kind of solution has been presented, for example, in U.S. Pat. No. 5,321,380 and EP patent application 318 955. By using this kind of basic structure it is possible to place the secondary winding on a separate substrate, for example, because the current is usually higher in the secondary winding than in the primary winding.

The drawback of such a structure is, however, that the assembly of the transformer on the mother board comprises several work phases which are not compatible with the automated manufacturing process used to place and solder the other components on the mother board. The introduction of the work phases required by the transformer assembly to the manufacturing process of the mother board thereby makes the manufacture of the mother board significantly more difficult.

SUMMARY OF THE INVENTION

The purpose of the invention is to eliminate the drawbacks described above and to create a transformer structure which (a) still maintains the price advantage characteristic of the above-described known structure integrated to the circuit board, and which (b) does not have the current tolerance or efficiency problems described above, and which (c) is fully compatible with the automatic manufacturing process of the mother board.

This goal is achieved by using a transformer structure as defined in the independent patent claim.

The idea of the invention is to implement the windings of a planar transformer (primary and secondary windings) substantially in their entirety on a separate piece of a supplementary circuit board (on a separate substrate). In this way it is possible, without losing the aforementioned advantages, to form from a supplementary board piece and from a transformer core a transformer component which can be mounted automatically on the mother board in the same manner as all the other components and attached to the mother board by using the same technique as with the other components.

Because the implementation of this kind of a planar transformer is not dependent on the circuit board on which the power supply and the circuits supplied by this supply are implemented, it is possible to use a circuit board in the transformer implementation in which the layer thickness and the number of layers have been optimized only for the requirements set by the power supply (without having other circuits on the circuit board set requirements for the circuit board). In this manner it is possible to freely select a circuit board with a layer thickness greater than that of the mother board and in which the number of layers is greater than in the mother board. When using the solution according to the invention, the windings of the planar transformer can be implemented, for example, by using a multiple layer circuit board in which, for example, the thickness of copper is 150 $\mu$m and the number of layers is ten.

BRIEF DESCRIPTION OF THE DRAWINGS

The description of the invention and its preferred embodiments will now be made with reference to examples shown in FIGS. 2a to 7 in the attached drawings, in which.

DETAILED DESCRIPTION OF THE INVENTION

Figure 2A:
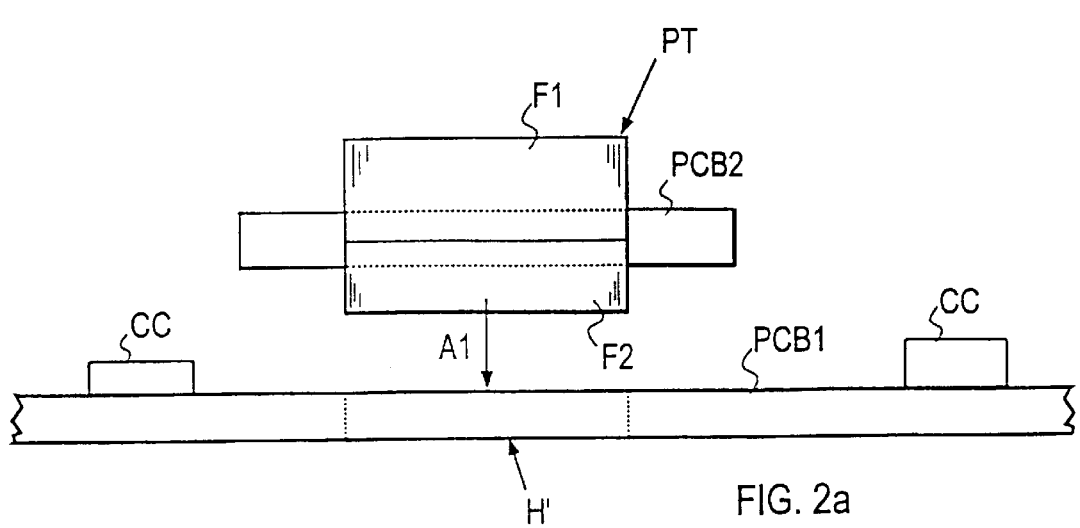
FIG. 2a illustrates the installation of a transformer component according to the invention on a mother board.
Figure 2B:
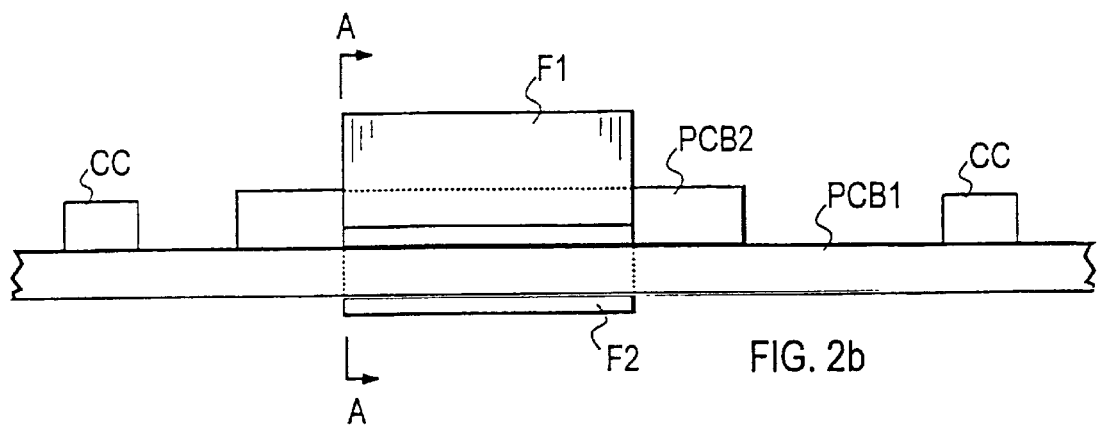
FIG. 2b is a side view of a planar transformer arrangement according to the invention.
Figure 3:
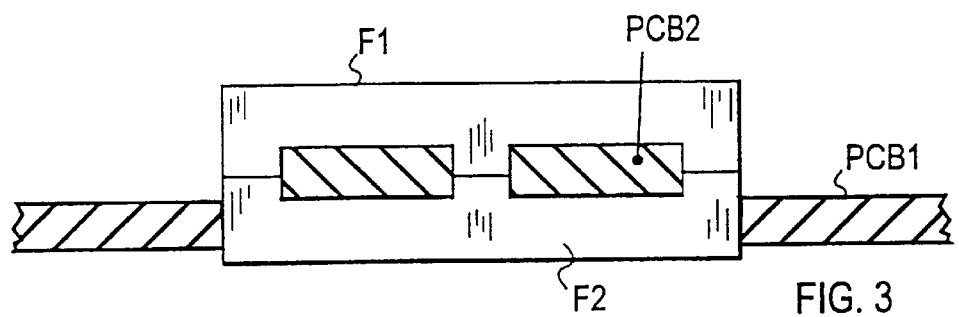
FIG. 3 is a cross-sectional view of the planar transformer arrangement shown in FIG. 2b taken along the line A—A.

FIGS. 2a and 2b show a planar transformer arrangement according to the invention as viewed from the side so that FIG. 2a illustrates the installation of the transformer component onto the circuit board (mother board) and FIG. 2b shows the situation when the transformer component is in place in the circuit board. FIG. 3 is a cross-sectional view of the planar transformer arrangement taken along line A—A of FIG. 2b.

According to the invention, the transformer windings (i.e. the primary and secondary windings) are implemented in their entirety on a separate piece of circuit board PCB2, around which the ferrite pieces F1 and F2, which form the transformer core, are attached. In the middle of this supplementary board piece has been formed a hole (H4, FIGS. 4 and 7) and the ferrite pieces F1 and F2, which form the transformer core and which are, for example, E-profiled, are set around the supplementary board piece so that the corresponding arms of E settle against one another. In this case the middle arms push through the hole in the supplementary board piece. The dimensions of the supplementary board piece and the ferrite pieces are such that the outer edge of the supplementary board piece comes against the inner surfaces of the outer arms of the ferrite piece. The ferrite pieces are locked to one another by using a suitable method, whereby a separate transformer component is formed. In FIG. 2a this component is indicated by the reference symbol PT. This transformer component is set (according to arrow A1 in FIG. 2a) in the hole H' formed on the mother board PCB1. The dimensions of the hole correspond essentially to those of the transformer core, whereby the lower surface of the part of the supplementary board piece which is left outside the transformer core settles against the upper surface of the mother board. Hole H' is indicated by using dashed lines in FIG. 2a.

Figure 1:
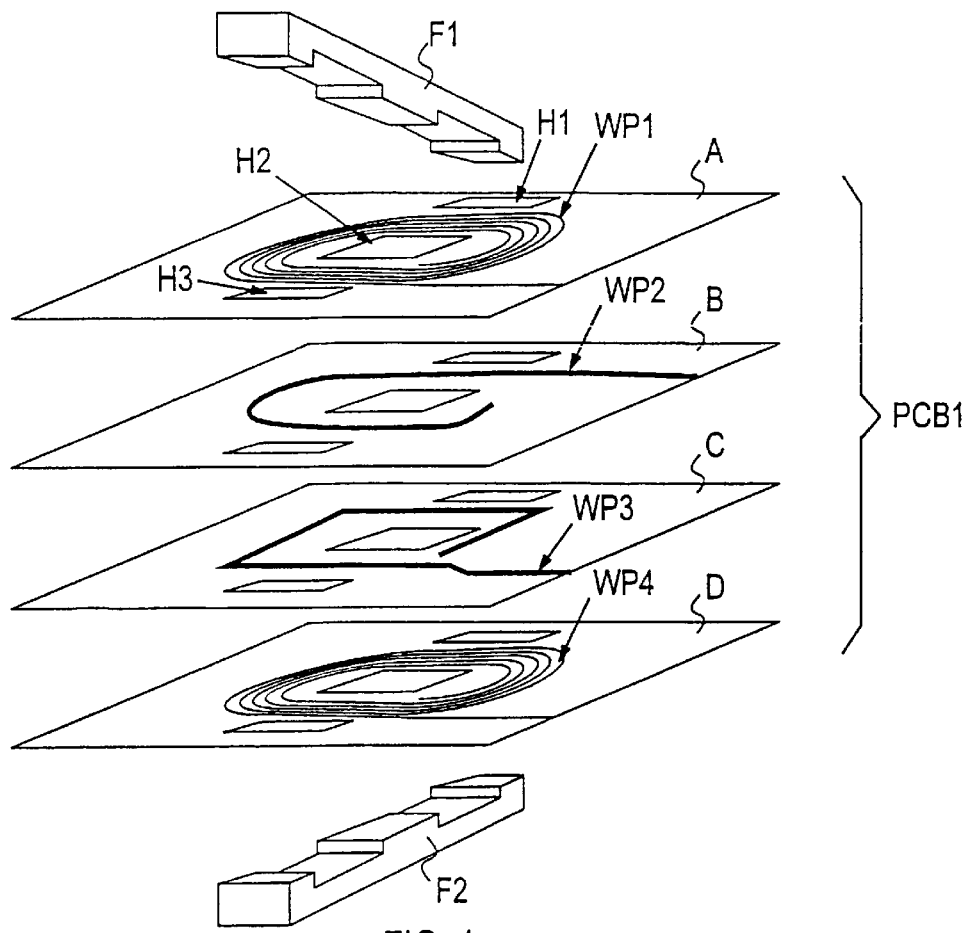
FIG. 1 illustrates a common method of implementing a planar transformer on a multiple layer circuit board.

The circuit board PCB1 which functions as the mother board can be a multiple layer circuit board of the type shown in FIG. 1, for example. However, the mother board does not contain the windings of the planar transformer, but rather component (indicated by the reference symbol CC) and conductive patterns which belong to the electric circuitry to be implemented on the mother board.

The windings located on the supplementary board piece are implemented by the same method as in the known solution according to FIG. 1. Issues as to the method used for connecting the conductive winding patterns of different layers to one another (parallel or serial), the number of turns in each layer, which layers form the primary winding and which layers form the secondary winding, can all vary in different ways depending on the situation and are not addressed here.

Figure 4:
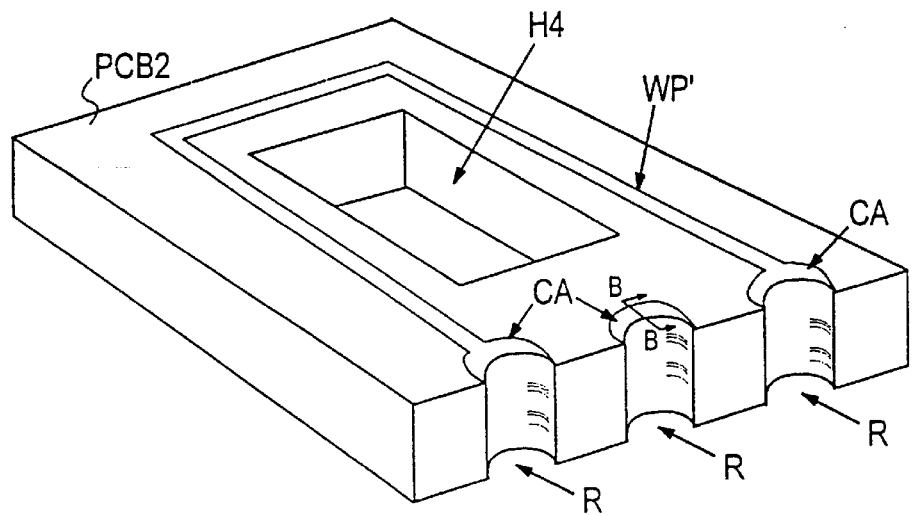
FIG. 4 illustrates a preferable embodiment of the supplementary circuit board piece.

FIG. 4 shows as a perspective view the supplementary board piece PCB2 in which the connections to the mother board have been implemented according to the preferred embodiment of the invention. The supplementary board piece is preferably formed from a multiple layer circuit board whose top layer winding pattern is indicated by the reference symbol WP'. On the outer edge of the supplementary board piece have been made recesses R, which are essentially semi-circular in shape with a metal-coated surface. As described later, this kind of connection can be manufactured, for example, by first drilling or cutting the normal lead-throughs in the board and then cutting the board in the middle of the lead-throughs.

Figure 5:
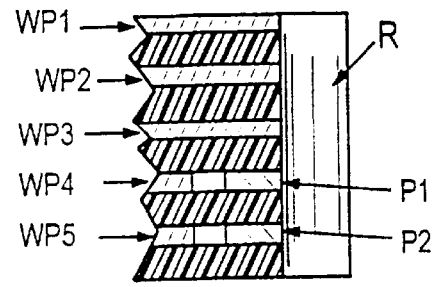
FIG. 5 illustrates the attachment of the conductive layers of the supplementary board piece to the connection surface.

According to an additional preferable embodiment of the invention, each conductive layer of the supplementary board piece contains a conductive pattern which is connected to the layer of metal in the recess R and extends at least some distance away from the recess. This conductive pattern is preferably the winding pattern of the layer in question, but it can also be a conductive pattern separate to the winding pattern, especially in layers in which the winding pattern does not reach the recess, but extends, for example, via an ordinary lead-through to the adjacent conductive layer. The embodiment of the type described above is illustrated in FIG. 5, which shows a cross-section of the supplementary board piece PCB2 at the recess R (along the line B—B in FIG. 4). In the example of FIG. 5, the conductive patterns of the three topmost conductive layers (WP1 to WP3) form the secondary winding, and the conductive patterns of the two bottommost conductive layers (WP4 and WP5) form the primary winding. The conductive patterns of the secondary winding are connected to the metal coating in the recess R, but because the conductive patterns of the primary winding are attached to another recess, these layers contain a separate conductive pattern (P1 and P2) which is connected to the metal coating in the recess. By using this kind of a solution it is possible to ensure that the metal coating in the recess does not break loose. The conductive pattern connected to the metal coating in the recess can also be a metallized connection area CA of the type shown in FIG. 4. This connection area can simultaneously connect the winding pattern of the layer in question to the connection surface. Every layer can thereby have this kind of connection area, regardless of whether the actual winding pattern of the layer in question reaches the connection surface. It is possible to further ensure the attachment of the metal coating in the recess by adding to the structure an extra lead-through with a metal coating connected at every conductive layer to the metal coating in the recess.

Figure 6A:
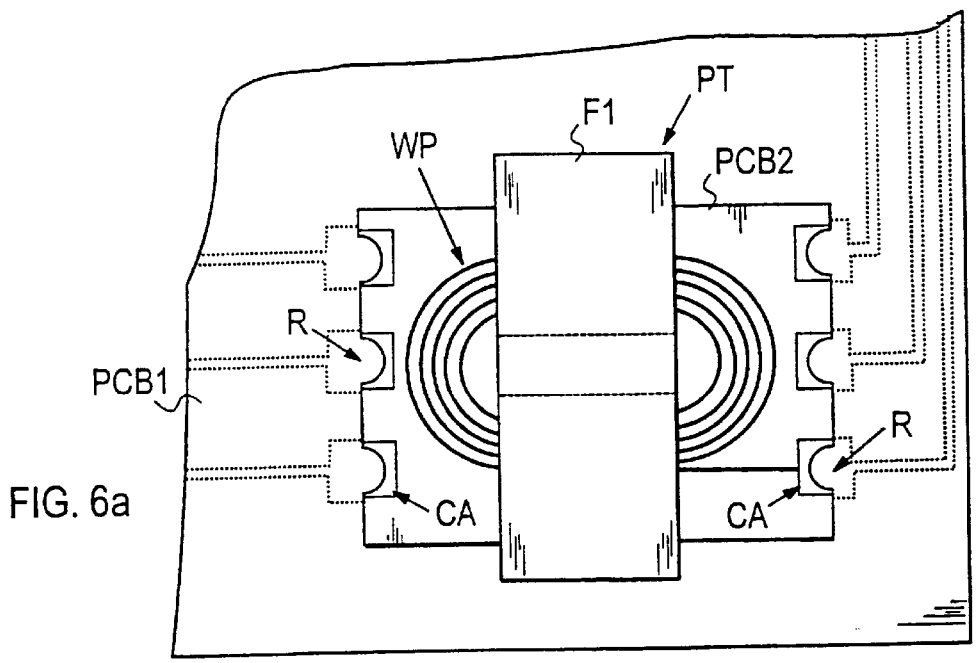
FIG. 6a illustrates the planar transformer arrangement as viewed from above, when the supplementary board pieces are of the type shown in FIG. 4, FIG. 6b corresponds to the view in FIG. 6 when the planar transformer component has been removed from the mother board.
Figure 6B:
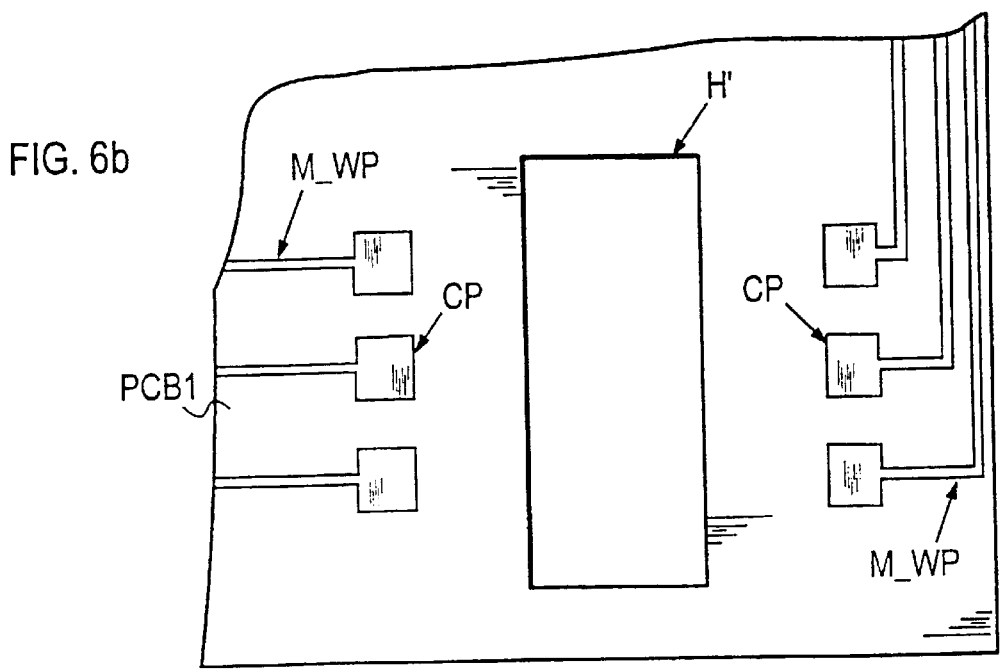

FIG. 6a illustrates a planar transformer arrangement of the type described above as seen from the top. The connection recesses R can be located at any point along the edge of the supplementary board piece, except in the area covered by the transformer core. FIG. 6b corresponds to the view in FIG. 6a, except that in FIG. 6b the transformer component PT has been removed from the mother board PCB1. As can be seen in FIG. 6b, the mother board comprises a hole H' corresponding to the transformer core, in which hole the transformer component is inserted, and at recesses R the connection areas CP of the winding patterns $M_{13}WP$ of the mother board, to which areas the connection recesses are soldered. (The conductive patterns of the mother board are indicated by dashed lines in FIG. 6a).

By placing the planar transformer windings in their entirety on a separate piece of circuit board, it is possible to create transformer components which can be mounted automatically on the mother board in the same manner as the other components (CC) of the mother board. By further equipping the supplementary board pieces with connection recesses R, it is possible to create connections which are easy and inexpensive to manufacture and in which the transformer components can be soldered, for example, by using the known reflow technology, during the same process as when all the other components are soldered on the mother board. In this manner no extra parts are needed for the transformer, such as additional legs (pins), etc., which would require additional work phases and increase the price. The solution according to the invention also has the additional advantage that it is easy to make conductive paths on the mother board because there are no windings to prevent this.

Figure 7:
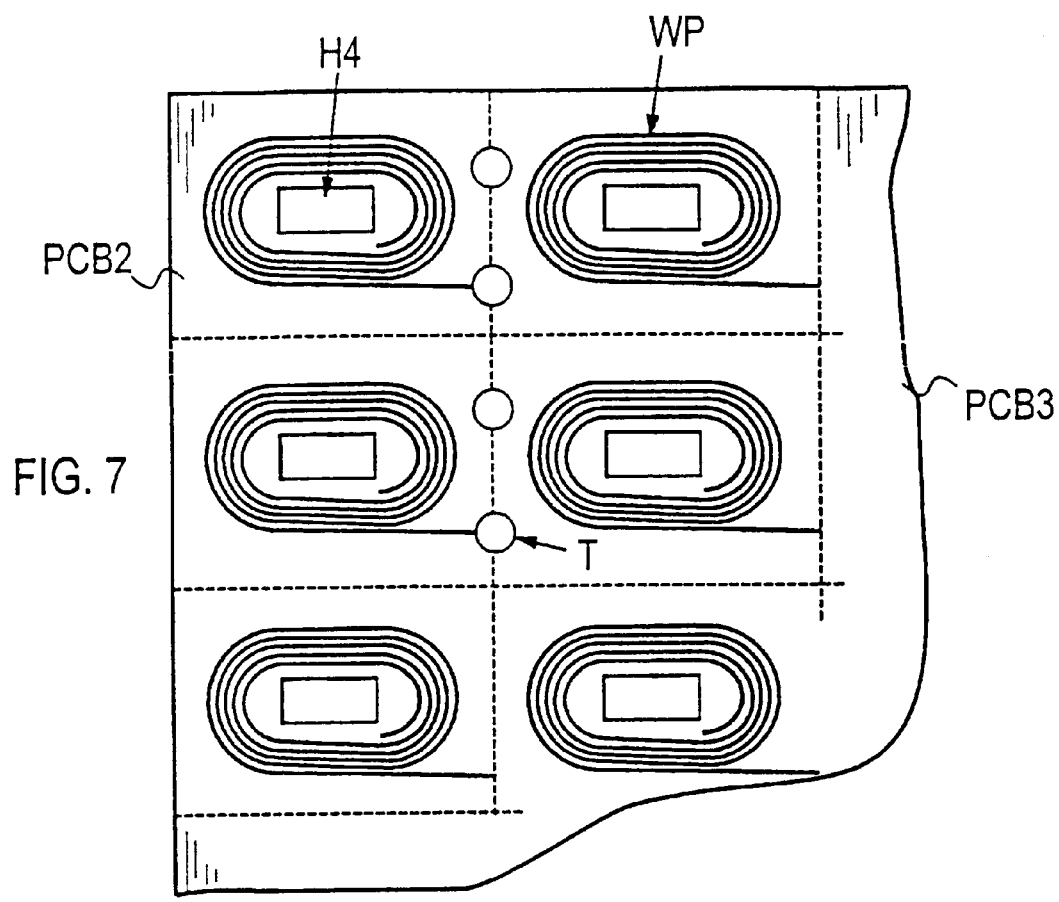
FIG. 7 shows a circuit board which is used to manufacture the supplementary circuit board pieces according to the invention.

FIG. 7 illustrates a possible manufacturing method of the circuit board pieces. A large multiple layer circuit board PCB3 (only a part of which is shown) is divided lengthwise into parts, in each of which are prepared the winding patterns WP and the metal-coated connection recesses required by the supplementary board pieces. The parts are separated from one another by perforations made, for example, by drilling or cutting, whereby the supplementary board pieces can later be separated from the circuit board PCB3 by bending. It is also possible to drill or cut lead-throughs T of greater diameter via the perforations to create connection recesses R.

Even though the invention is described above by referring to examples according to the attached drawings, it is clear that the invention is not limited to these embodiments, but can be varied in many ways according to the capabilities of a person skilled in the art. In principle, the transformer component can be attached to the mother board by using some other method, for example, by gluing, although the method described above is preferable because it does not require any separate mechanical attachment. Also, the electric connection of the transformer to the mother board can be implemented (without separate connectors) in many ways, for example, by using lead-through holes formed on the supplementary board piece. The metal-coated recesses located at the outer edge of the supplementary board piece are, however, a preferable (simple) alternative as far as manufacturing is concerned. Additionally, the profiles of the ferrites used in the transformer can vary. It is also possible to manufacture the supplementary circuit board pieces from an ordinary two-sided circuit board, if this is feasible for the application in question. Naturally, the transformer arrangement can also be used in applications other than for power supplies.

What is claimed is:

1. A planar transformer arrangement for an electric circuit located on a circuit board, the arrangement comprising:
    a first circuit board (PCB1) on which an electric circuit has been implemented,
    a supplementary circuit board piece (PCB2),
    a primary winding which comprises at least one substantially planar winding pattern,
    a secondary winding which comprises at least one substantially planar winding pattern, and
    a transformer core (F1, F2) which surrounds the primary and secondary windings at least partially,
    wherein
    both the primary and the secondary windings are formed on said supplementary circuit board piece (PCB2); and wherein
    the transformer core (F1, F2) is attached to the supplementary circuit board piece (PCB2), whereby the transformer core and the supplementary circuit board piece form together a separate planar transformer component (PT), and
    a hole (H') which corresponds to the transformer core has been formed on the first circuit board (PCB1) into which the planar transformer component (PT) has been inserted; and wherein
    the supplementary circuit board piece is manufactured from a multiple layer circuit board and its outer edge features at least one recess (R) with a metal-coated surface, the supplementary circuit board piece being electrically connected to the first circuit board at the recess.

2. A planar transformer arrangement according to claim 1, wherein the recess is substantially semi-circular in shape.

3. A planar transformer arrangement according to claim 1, wherein each conductive layer of the supplementary circuit board piece comprises a conductive pattern which is connected to the metal coating of the recess (R).

4. A planar transformer arrangement according to claim 3, wherein the conductive pattern (P1, P2) is electrically separated from the winding pattern of the layer in question.

5. A planar transformer arrangement according to claim 3, wherein the conductive pattern (CA) forms a continuous conductive pattern with the winding pattern.

* * * * *